(12) United States Patent
Emoto

(10) Patent No.: US 10,266,766 B2
(45) Date of Patent: Apr. 23, 2019

(54) PHOSPHOR, LIGHT-EMITTING ELEMENT AND LIGHTING DEVICE

(71) Applicant: DENKA COMPANY LIMITED, Tokyo (JP)

(72) Inventor: Hideyuki Emoto, Machida (JP)

(73) Assignee: DENKA COMPANY LIMITED, Tokyo (JP)

(*) Notice: Subject to any disclaimer, the term of this patent is extended or adjusted under 35 U.S.C. 154(b) by 0 days.

(21) Appl. No.: 14/442,625

(22) PCT Filed: Nov. 12, 2013

(86) PCT No.: PCT/JP2013/080527
§ 371 (c)(1),
(2) Date: May 13, 2015

(87) PCT Pub. No.: WO2014/077240
PCT Pub. Date: May 22, 2014

(65) Prior Publication Data
US 2016/0280994 A1    Sep. 29, 2016

(30) Foreign Application Priority Data

Nov. 13, 2012  (JP) ................................ 2012-248886

(51) Int. Cl.
*H01L 33/00* (2010.01)
*C09K 11/77* (2006.01)
(Continued)

(52) U.S. Cl.
CPC ...... *C09K 11/7734* (2013.01); *C09K 11/0883* (2013.01); *F21V 9/08* (2013.01); *H01L 33/502* (2013.01); *H01L 33/56* (2013.01)

(58) Field of Classification Search
CPC .... C09K 11/77; C09K 11/7728; H01L 33/502
See application file for complete search history.

(56) References Cited

U.S. PATENT DOCUMENTS 7,258,818 B2 *  8/2007  Sakata .................. C04B 35/597
                                                        252/301.4 F
8,497,624 B2 *  7/2013  Sakata ............... C09K 11/0883
                                                        252/301.4 R
(Continued)

FOREIGN PATENT DOCUMENTS

CN      101755030 A    6/2010
EP      1555307 A2     7/2005
(Continued)

OTHER PUBLICATIONS

International Search Report, issued in PCT/JP2013/080527, dated Dec. 17, 2013.
(Continued)

*Primary Examiner* — Mounir S Amer
*Assistant Examiner* — Alexander Belousov
(74) *Attorney, Agent, or Firm* — Birch, Stewart, Kolasch & Birch, LLP

(57) ABSTRACT

Provided is a Li-solid-solubilized α-SiAlON phosphor containing $Li^+$ as solid solubilized for stabilization of the structure that is higher in luminous efficiency than before and a light-emitting element and a lighting device comprising the same.
The (Li and Eu)-containing α-SiAlON crystal has a Li content of 1.8 to 3 mass %, an Eu content of 0.1 to 1.5 mass % and an average particle diameter, as determined by laser diffraction/scattering method, of 7 to 35 μm. The phosphor is used in the light-emitting element and the lighting device.

8 Claims, 3 Drawing Sheets

(51) Int. Cl.
*C09K 11/08* (2006.01)
*F21V 9/08* (2018.01)
*H01L 33/50* (2010.01)
*H01L 33/56* (2010.01)

(56) References Cited

U.S. PATENT DOCUMENTS

| | | | | |
|---|---|---|---|---|
| 8,628,687 B2* | 1/2014 | Yamao | ................ | C04B 35/597 |
| | | | | 252/301.4 F |
| 8,883,039 B2* | 11/2014 | Hirosaki | ............ | C09K 11/0883 |
| | | | | 252/301.4 F |
| 2005/0116244 A1* | 6/2005 | Sakata | ................ | C04B 35/597 |
| | | | | 257/98 |
| 2009/0091237 A1* | 4/2009 | Hirosaki | ............ | C09K 11/0883 |
| | | | | 313/495 |
| 2009/0284948 A1* | 11/2009 | Yamao | ................ | C04B 35/597 |
| | | | | 362/84 |
| 2010/0164367 A1 | 7/2010 | Shioi et al. | | |
| 2011/0133629 A1* | 6/2011 | Sakata | ............ | C09K 11/0883 |
| | | | | 313/483 |
| 2012/0319566 A1* | 12/2012 | Sakata | ............... | C09K 11/0883 |
| | | | | 313/503 |
| 2013/0001815 A1* | 1/2013 | Yamao | ................ | C04B 35/597 |
| | | | | 264/21 |
| 2014/0197362 A1* | 7/2014 | Sakata | ............... | C09K 11/0883 |
| | | | | 252/301.4 F |
| 2015/0083966 A1* | 3/2015 | Hirosaki | ............ | C09K 11/0883 |
| | | | | 252/301.4 F |
| 2016/0280994 A1* | 9/2016 | Emoto | ............... | C09K 11/0883 |

FOREIGN PATENT DOCUMENTS

| | | |
|---|---|---|
| EP | 2036966 A1 | 3/2009 |
| JP | 2002-363554 A | 12/2002 |
| JP | 2010-202738 A | 9/2010 |
| JP | 2010-241995 A | 10/2010 |
| JP | WO 2012/046288 A1 | 4/2012 |
| TW | 200730605 | 6/1995 |
| WO | WO 2007/004493 A1 | 1/2007 |
| WO | WO 2010/018873 A1 | 2/2010 |
| WO | WO 2011/108740 A1 | 9/2011 |

OTHER PUBLICATIONS

Extended European Search Report, dated May 18, 2016, for European Application No. 13854407.7.
European Search Report, dated May 18, 2016, for European Application No. 13855350.8.

* cited by examiner

[Fig. 1]
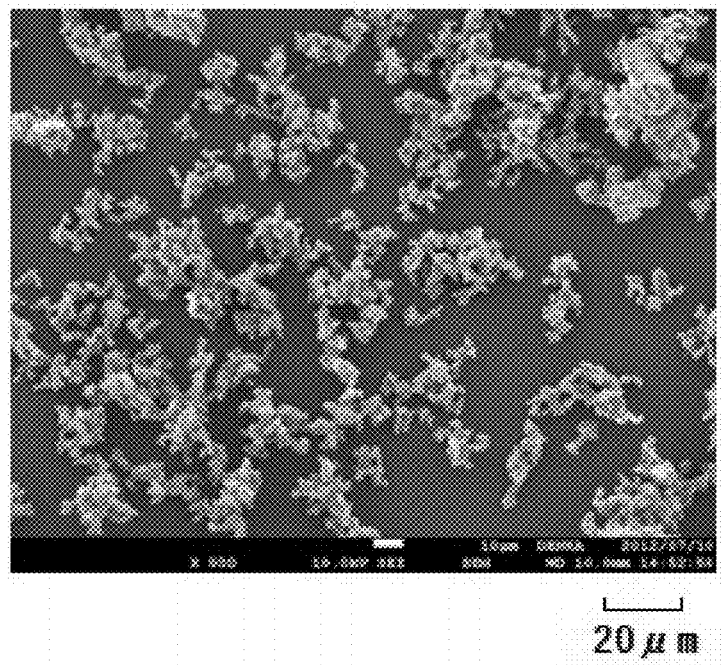
A
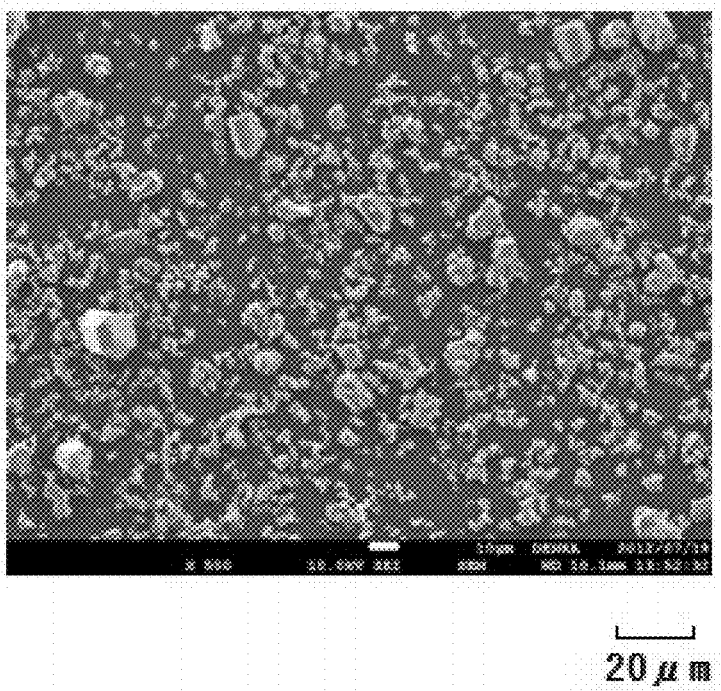
B

[Fig. 2]
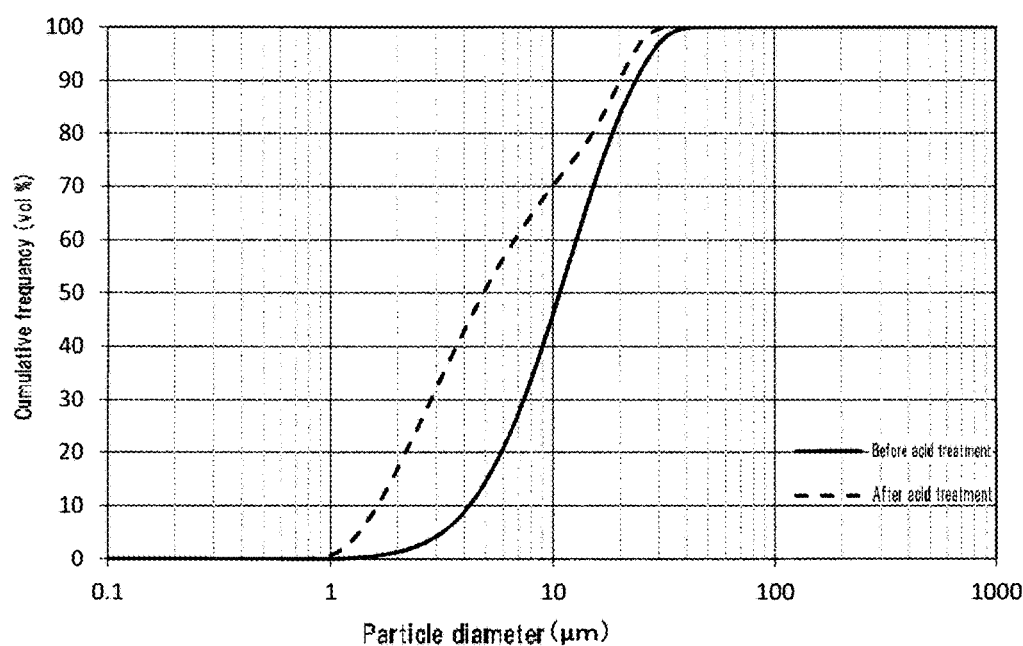

[Fig. 3]
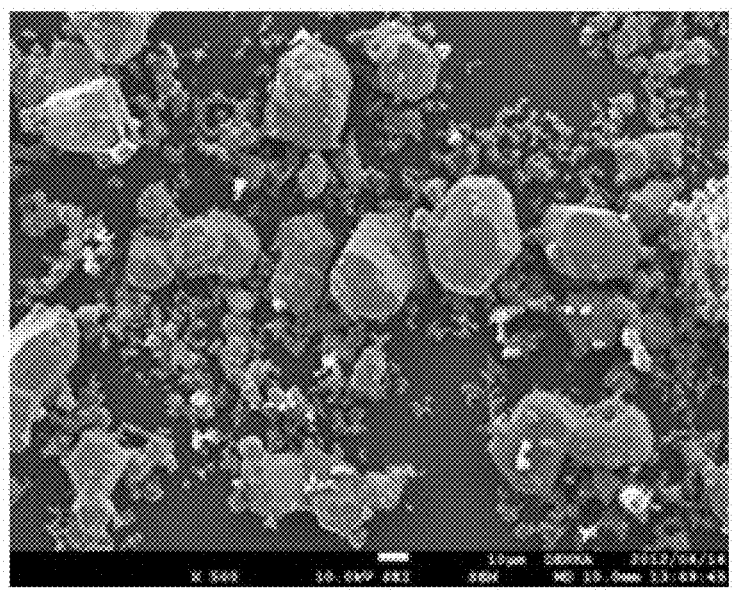
A
20 μm
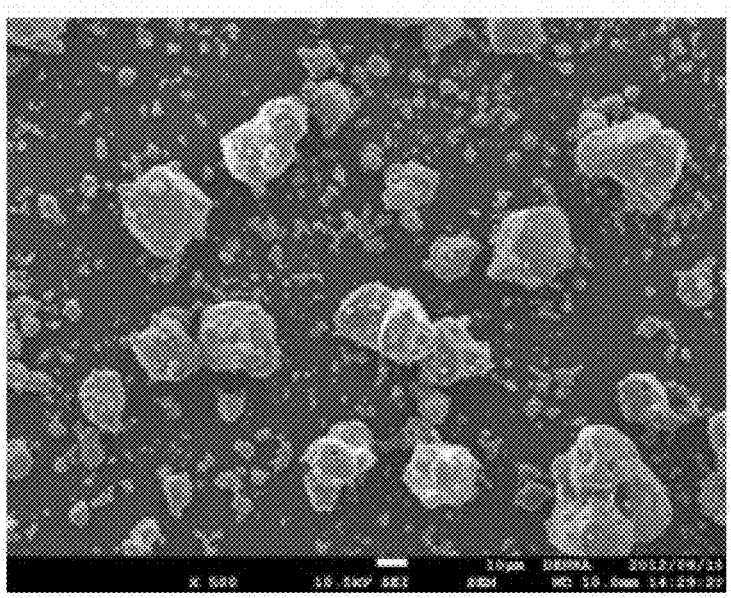
B
20 μm

PHOSPHOR, LIGHT-EMITTING ELEMENT AND LIGHTING DEVICE

TECHNICAL FIELD

The present invention relates to a phosphor as well as a light-emitting element and a lighting device comprising the phosphor. More specifically, it relates to a phosphor, a light-emitting element, and a lighting device that emit orange light, as excited by ultraviolet to blue light.

BACKGROUND ART

Ca-solid-solubilized α-SiAlON phosphors represented by General Formula: $Ca_xEu_ySi_{12-(m+n)}Al_{(m+n)}O_nN_{16-n}$ (wherein, x and y each are a value of more than 0 and less than 2; x+y is a value of more than 0 and 2 or less; m is 2(x+y); and n is a value of 0.5 or more and 2 or less) were known (see Patent Document 1). As described for the phosphor of Patent Document 1, it is possible by using $Ca^{2+}$ as the metal ion for stabilization of crystal structure to obtain a crystal structure stable in a wide compositional range and thus having high luminous efficiency. Alternatively, Li-solid-solubilized α-SiAlON phosphors containing $Li^+$ as the metal ion for stabilization of crystal structure were also proposed (see Patent Documents 2 to 4).

CITATION LIST

Patent Literatures

[Patent Document 1] JP-A No. 2002-363554
[Patent Document 2] WO No. 2007/004493
[Patent Document 3] WO No. 2010/018873
[Patent Document 4] JP-A No. 2010-202738

SUMMARY OF INVENTION

Technical Problem

Eu-activated Ca-solid-solubilized α-SiAlON phosphors such as those described in Patent Document 1 show the highest luminous efficiency when they emit orange light. On the other hand, Li-solid-solubilized α-SiAlON phosphors such as those described in Patent Documents 2 to 4 emits a light having a fluorescence spectrum blueshifted (i.e., shifted toward shorter wavelength), compared to the Ca-solid-solubilized α-SiAlON phosphors, but have a problem that the fluorescence intensity declines with the blueshift.

An object of the present invention is to provide a Li-solid-solubilized α-SiAlON phosphor containing $Li^+$ solid-solubilized for stabilization of crystal structure that is higher in luminous efficiency than before, and a light-emitting element and a lighting device comprising the same.

Solution to Problem

The inventors have studied intensively the relationship between the composition and the luminous efficiency of Li-solid-solubilized α-SiAlON phosphors wherein $Li^+$, which was used traditionally for reduction of the wavelength of the emission light, was used for stabilization of the crystal structure, and found that it is possible to make a phosphor show extremely high luminous efficiency by controlling the size of the primary particles constituting the phosphor in a particular range and made the present invention.

The phosphor according to the present invention is a phosphor comprising (Li and Eu)-containing α-SiAlON crystal having a Li content of 1.8 to 3 mass %, an Eu content of 0.1 to 1.5 mass %, and a particle diameter at a cumulative volume of 50% in the particle size distribution (hereinafter, referred to as average particle diameter), as determined by laser diffraction/scattering method, of 7 to 35 μm.

The phosphor preferably has a particle diameter at a cumulative volume of 10% in the particle diameter distribution (hereinafter, referred to as particle diameter (D10)), as determined by laser diffraction/scattering method, of 4 μm or more and a particle diameter at a cumulative volume of 90% (hereinafter, referred to as particle diameter (D90)) of 45 μm or less.

The light-emitting element according to the present invention comprises the phosphor described above and a light source irradiating excitation light to the phosphor.

The light source is preferably a LED (Light Emitting Diode) or a LD (Laser Diode) having a peak emission wavelength of 240 to 480 nm.

The lighting apparatus according to the present invention comprises the light-emitting element described above.

Effects of Invention

It is possible according to the present invention to prepare a phosphor showing a luminous efficiency higher than before when it emits orange light, because the size of the primary particles constituting the Eu-activated Li-solid-solubilized α-SiAlON is specified.

BRIEF DESCRIPTION OF DRAWINGS

FIGS. 1A and 1B are scanning electron micrographs showing the change in microstructure of the phosphor of Comparative Example 1 between before and after an acid treatment that was performed for determination of average particle diameter. FIG. 1A shows the state before acid treatment, while FIG. 1B shows the state after acid treatment (of the phosphor of Comparative Example 1).

FIG. 2 is a graph showing the particle size distribution, as determined by laser diffraction/scattering method, of the phosphor of Comparative Example 1 (before acid treatment) and also that after an acid treatment performed for measurement of average particle diameter.

FIGS. 3A and 3B are scanning electron micrographs showing the change in microstructure of the phosphor of Example 1 between before and after an acid treatment that was performed for determination of average particle diameter. FIG. 3A shows the state before acid treatment, while FIG. 3B shows the state after acid treatment (of the phosphor of Example 1).

DESCRIPTION OF EMBODIMENTS

Hereinafter, favorable embodiments of the invention will be described in detail with reference to attached drawings.

First Embodiment

The phosphor according to the first embodiment of the present invention relates to a (Li and Eu)-containing α-SiAlON crystal (hereinafter, referred to as Eu-activated Li-solid-solubilized α-SiAlON crystal) having a Li content of 1.8 to 3 mass %, an Eu content of 0.1 to 1.5 mass %, and an average particle diameter, as determined by laser diffraction/scattering method, of 7 to 35 μm.

[Composition]

The Eu-activated Li-solid-solubilized α-SiAlON crystal constituting the phosphor of the present embodiment is represented by General Formula: $Li_xEu_ySi_{12-(m+n)}Al_{m+n}O_nN_{16-n}$ (x+y≤2, m=x+2y). An α-SiAlON crystal is an α-silicon nitride crystal wherein part of the Si—N bonds are replaced with Al—N and Al—O bonds and Li and Eu are solid-solubilized in the opening of the crystal for preservation of electrical neutrality. m and n respectively correspond to the numbers of the Al—N and Al—O bonds incorporated, as substituted, into a unit cell.

[Solid-Solubilized Metal Element]

In the phosphor of the present embodiment, $Li_+$ was used as the metal ion for stabilization of crystal structure, not for blueshift of the fluorescent light but for improvement of the high fluorescence intensity in a particular composition range, compared to the phosphors containing solid-solubilized $Ca^{2+}$.

The composition of the solid-solubilized α-SiAlON is restricted by the number of the solid solubilization sites of the metal ion used for stabilization of crystal structure and also by the thermodynamical stability of the metal ion used for stabilization of crystal structure. In the case of $Li^+$, m and n suitable for preservation of the α-SiAlON structure are both 0.5 to 2.

In the case of the phosphor in the present embodiment, part of Li in the phosphor represented by General Formula described above may be replaced for fine adjustment of fluorescence properties with one or more elements selected from the group consisting of Mg, Ca, Y, and lanthanoids (however, excluding La, Ce, and Eu), while the electrical neutrality is preserved.

[Li Content: 1.8 to 3 Mass %]

When the Li content in the phosphor of the present embodiment is excessively small, specifically less than 1.8 mass %, grain growth in the phosphor-calcining step progresses significantly slowly, making it difficult to produce large particles with high fluorescence intensity. Alternatively when the Li content in the phosphor of the present embodiment is excessively large, specifically more than 3 mass %, heterogeneous phases such as of $LiSi_2N_3$ may be formed in addition to the α-SiAlON crystal. Thus, the Li content in the phosphor of the present embodiment is preferably 1.8 to 3 mass %.

The Li content may be altered according to the raw materials blended for production of the phosphor. Specifically, it is possible to adjust the Li content by increasing or decreasing the blending rates of lithium nitride and lithium oxide blended as Li-containing raw materials.

[Eu Content: 0.1 to 1.5 Mass %]

When the Eu content in the phosphor of the present embodiment is excessively small, specifically less than 0.1 mass %, contribution of Eu to emission becomes smaller, leading to reduction of the fluorescence intensity. Alternatively when the Eu content in the phosphor of the present embodiment is excessively large, specifically more than 1.5 mass %, the fluorescence intensity may be reduced by concentration quenching of fluorescence by energy transfer between $Eu^{2+}$ ions. Thus, the Eu content in the phosphor in the present embodiment is preferably 0.1 to 1.5 mass %.

The Eu content may be altered according to the raw materials blended for production of the phosphor. Specifically, it is possible to adjust the Eu content by increasing or decreasing the blending rates of europium oxide and europium nitride that are used as the Eu-containing raw materials.

[Average Particle Diameter: 7 to 35 μm]

When the average particle diameter of the phosphor in the present embodiment is excessively small, specifically less than 7 μm, the fluorescence intensity may decline. Alternatively when the average particle diameter of the phosphor in the present embodiment is excessively large, specifically more than 35 μm, the emission color may show fluctuation in chromaticity and have color irregularity when the phosphor is installed on the light-emitting face of a light-emitting diode. Thus, the average particle diameter of the phosphor in the present embodiment is preferably 7 to 35 μm. As described above, the average particle diameter, as used herein, is the particle diameter (D50) at a cumulative volume of 50% in the particle diameter distribution, as determined by laser diffraction/scattering method.

Generally, the diameter of a particle is determined by image analysis of a scanning electron microscope (SEM) photograph. This method permits accurate measurement if single-crystal particles are present in the monodispersion state, but it is not suited for measurement of aggregated crystal particles. α-SiAlONs prepared in solid phase reaction at high temperature often have a microstructure containing secondary particles that are produced by multiple calcination of particles (called primary particles) and thus, it is not possible, by the SEM method described above, to determine the particle diameter accurately, because the particles are present, as piled three-dimensionally on top of one another.

Thus in measurement of the phosphor in the present embodiment, the interfacial layer between the primary particles constituting secondary particles was first dissolved and removed selectively by acid treatment and the particle size of the primary particle thus obtained and the distribution thereof were determined on a common particle size distribution analyzer. The components other than α-SiAlON were then dissolved and removed under the following acid-treatment condition: An α-SiAlON powder was stirred in a suitable amount of a processing solution, which was obtained by diluting a mixed acid of hydrofluoric acid and nitric acid with distilled water, under heat for a certain period of time and filtered and washed.

The processing solution used was obtained by mixing hydrofluoric acid (concentration: in the range of 46 to 48 g/100 ml) and nitric acid (concentration: 60 g/100 ml) at a ratio of 1:1 and diluting the mixture four times with distilled water. The processing solution was heated to 80° C. An α-SiAlON powder in an amount of 20 g or less was dispersed in 100 ml of the processing solution, as the solution was agitated, and the mixture was left in that state for 0.5 hour. Insoluble powder was collected by decantation, washed, and dried, to give an α-SiAlON containing no interparticle layer. The α-SiAlON collected, the phosphor of the present embodiment, was analyzed on a laser-diffraction particle size distribution analyzer for determination of the average particle diameter.

The phosphor in the present embodiment may be a phosphor in the secondary particle state without acid treatment if the average particle diameter thereof is in the range of 7 to 35 μm, or a phosphor in the primary particle state obtained after the secondary particles therein are dispersed by acid treatment.

[Particle Diameter Distribution]

The phosphor in the present embodiment preferably has a particle diameter (D10) of 4 μm or more and a particle diameter (D90) of 45 μm or less and such a phosphor has further improved luminous efficiency. Fine particles having a particle diameter (D10) of less than 4 μm may scatter visible light easily, possibly leading to deterioration of the excitation efficiency of the phosphor. Particles having a particle diameter (D90) of more than 45 μm are less dispersible in the sealing resin and are non-homogeneously miscible with other color phosphors when the particles are used in production of a white LED and thus may cause fluctuation in chromaticity and color irregularity of the irradiation face of the white LED.

As described above in detail, the phosphor of the present embodiment, of which the size of the primary particle constituting the Eu-activated Li-solid-solubilized α-SiAlON is specified, can emits orange light at a high luminous efficiency not possible hitherto. The phosphor of the present embodiment is suited as a phosphor excited by ultraviolet or blue light.

Second Embodiment

The light-emitting element in the second embodiment of the present invention comprises a phosphor and a light source and the phosphor used is the phosphor in the first embodiment described above. The light source, which irradiates the phosphor with excitation light, is for example a light source that has a peak wavelength that gives the highest light intensity in the range of 240 to 480 nm. Particularly preferable is a light-emitting diode or a laser diode having a peak emission wavelength in the range described above. The light-emitting element of the present embodiment, which comprises the phosphor of the first embodiment described above, is higher in luminous efficiency than before and shows favorable emission characteristics.

Third Embodiment

The lighting apparatus in the third embodiment of the present invention is a lighting apparatus comprising the light-emitting element in the second embodiment described above. The lighting apparatus of the present embodiment, which comprises the light-emitting element that is higher in luminous efficiency than before and shows favorable emission characteristics, gives higher light intensity and shows favorable optical properties.

EXAMPLES

Hereinafter, effects of the present invention will be described with reference to Tables and Figures, as Examples and Comparative Examples of the present invention are compared.

Comparative Example 1

A phosphor comprising an Eu-activated Li-solid-solubilized α-SiAlON crystal and having a Li content of 2.6 mass %, an Eu content of 0.53 mass %, and an average primary particle diameter of 4.9 μm was prepared in Comparative Example 1 in the raw material-mixing step and the calcining step described below.

<Mixing Step>

Raw materials used were as follows: silicon nitride powder (E10 grade produced by Ube Industries, Ltd.), aluminum nitride powder (F grade produced by Tokuyama Corporation), aluminum oxide powder (TM-DAR grade produced by Taimei Chemicals Co., Ltd.), europium oxide powder (RU grade produced by Shin-Etsu Chemical Co., Ltd.), and lithium nitride powder (produced by Materion Corporation, purity: 99.5%, 60 mesh).

Silicon nitride, aluminum nitride, aluminum oxide, and europium oxide were weighed respectively in amounts of 84.29 mass %, 13.55 mass %, 2.21 mass %, and 0.63 mass %. These ingredients were wet mixed in ethanol solvent for 1 hour, using a silicon nitride pot and balls, and the slurry obtained was suction-filtered for removal of the solvent and then dried. The agglomerate obtained after drying was pulverized in a mortar, to give a preliminary powder mixture.

In a glove box under nitrogen environment, the preliminary powder mixture and lithium nitride powder were mixed in a mortar, to give a raw powder mixture. The mixing ratio of preliminary powder mixture:lithium nitride powder then was 94.83:5.17 by mass ratio.

<Calcining Step>

In a glove box similar to that used in the mixing step, the raw powder mixture obtained in the mixing step was filled into a boron nitride crucible and calcined in a carbon heater electric furnace for 8 hours under a temperature condition of 1800° C. in a nitrogen environment pressurized to a gauge pressure of 0.7 MPa, to give an Eu-activated Li-solid-solubilized α-SiAlON. The Eu-activated Li-solid-solubilized α-SiAlON was classified in size by passing all of it through a sieve having an opening of 150 μm and then only the powder that passed through a sieve having an opening of 45 μm was collected.

Example 1

The phosphor powder of Example 1 was prepared in a manner similar to the method and condition of Comparative Example 1, except that the blending rate of the raw materials for preparation of the preliminary powder mixture was changed to silicon nitride: 84.04 mass %, aluminum nitride: 14.73 mass %, and europium oxide: 0.63 mass %, and, the mixing rate of preliminary powder mixture: lithium nitride powder used in preparation of the raw powder mixture was changed to 94.85:5.15 by mass ratio.

Powder X-ray diffraction analysis thereof showed that the crystalline phase present in the phosphor of Example 1 contained α-SiAlON as the main phase and additionally a small amount of $LiSi_2N_3$ as the heterogeneous phase.

<Measurement of Li and Eu Contents>

The Li and Eu contents in the phosphors of Example 1 and Comparative Example 1 were determined by ICP (Inductively Coupled Plasma) emission spectroscopy.

<Average Primary Particle Diameter>

The average primary particle diameter of the phosphors of Example 1 and Comparative Example 1 was determined in the following manner: First, a processing solution was prepared by diluting 1:1 mixture of hydrofluoric acid (concentration: in the range of 46 to 48 g/100 ml) and nitric acid (concentration: 60 g/100 ml) four times with distilled water. The processing solution was heated to 80° C., and the phosphor of Example or Comparative Example in an amount of 20 g or less was added to and dispersed in 100 mL of the processing solution, as the solution was agitated. The mixture was left still for 1 hour after dispersion and the insoluble powder was collected by decantation. The collected insoluble powder was washed with water and dried.

The insoluble powder after drying was subjected to particle diameter distribution measurement on a laser-diffraction/scattering particle size distribution analyzer (LS 13 320 manufactured by Beckman Coulter Inc.) and the particle diameter at a cumulative volume of 50% was used as the average particle diameter.

FIG. 1 includes scanning electron micrographs showing the microstructures of the phosphor of Comparative Example 1 before and after acid treatment for measurement of average particle diameter. FIG. 1A shows the state of the phosphor of Comparative Example 1 (before acid treatment), while FIG. 1B shows the state thereof after acid treatment. FIG. 2 is a graph showing the particle size distribution of the phosphors of Comparative Example 1 before and after acid treatment, as determined by laser diffraction/scattering method. FIG. 3 includes scanning electron micrographs showing the microstructures of the phosphor of Example 1 before and after acid treatment for measurement of average particle diameter. FIG. 3A shows the state of the phosphor of Example 1 before acid treatment, while FIG. 3B shows the state thereof after acid treatment.

As shown in FIGS. 1 and 3, the phosphors of Example 1 and Comparative Example 1, which were dispersed by acid treatment, contained mainly primary particles. As shown in FIG. 2, there is difference in the particle size distribution, as determined by laser diffraction/scattering method, between before and after acid treatment and the average particle diameter (D50) was shown to be smaller after the acid treatment. As shown in FIG. 3, the phosphor of Example 1 had a microstructure containing both large particles of about 10 μm and small particles of several μm and the average primary particle diameter of the phosphor was governed by the ratio of them.

<D10 and D90>

The particle diameter (D10) and the particle diameter (D90) of the phosphors of Example 1 and Comparative Example 1 were determined by measuring the particle diameter distribution of the phosphors before acid treatment on a laser diffraction/scattering particle size distribution analyzer (LS 13 320 manufactured by Beckman Coulter Inc.)

<Relative Fluorescence Peak Intensity and Peak Wavelength>

The fluorescence peak intensity and the peak wavelength of the phosphors of Example 1 and Comparative Example 1 were determined from a fluorescence spectrum obtained at an excitation wavelength of 455 nm on a fluorospectrophotometer (F7000 produced by Hitachi High-Technologies Corporation). The light intensity has an arbitrary unit, as it varies according to the analyzer and the condition used, and the light intensities at the peak wavelengths of the phosphors of Example and Comparative Example, as determined under the same condition, were compared with each other. The intensity of the fluorescence peak of Comparative Example 1 was used as 100%.

The results above are summarized in the following Table 1.

TABLE 1

| | Phosphor composition | | Average particle diameter | Particle diameter (μm) | | Fluorescence properties (when excited at 455 nm) | |
|---|---|---|---|---|---|---|---|
| | Li (mass %) | Eu (mass %) | (μm) | D10 | D90 | Relative fluorescence peak intensity | Peak wavelength (nm) |
| Example 1 | 2.55 | 0.53 | 18.9 | 4.8 | 38.5 | 156% | 582 |
| Comparative Example 1 | 2.65 | 0.53 | 4.9 | 1.7 | 23.7 | 100% | 583 |

As shown in Table 1 above, the phosphor of Example 1, which had a slightly larger average particle diameter, gave a fluorescence peak intensity significantly larger than that of the phosphor of Comparative Example 1.

Examples 2 to 6 and Comparative Examples 2 to 4

The phosphors of Examples 2 to 6 and Comparative Examples 2 to 4 were prepared respectively by processing powder mixtures containing the raw powders used in Example 1 and Comparative Example 1 at various blending rates by a method and under a condition similar to those in Comparative Example 1 and additionally performing the acid treatment carried out in Comparative Example 1 for measurement of the average primary particle diameter. X-ray diffraction analysis thereof showed that all phosphors had a crystalline phase mostly consisting of α-SiAlON single phase.

The Li and Eu contents, the particle size distribution, and the peak wavelength and peak intensity, as determined from the fluorescence spectrum obtained when excited by a light having a wavelength of 455 nm, of these phosphors were determined similarly to Comparative Example 1. Because the phosphors of Examples 2 to 6 and Comparative Examples 2 to 4 were treated with acid, the average particle diameter obtained by the particle size distribution measurement corresponds to the average particle diameter of the primary particles. The results are summarized in the following Table 2.

TABLE 2

| | Phosphor composition | | Average particle diameter | Particle diameter (μm) | | Fluorescence properties (when excited at 455 nm) | |
| --- | --- | --- | --- | --- | --- | --- | --- |
| | Li (mass %) | Eu (mass %) | (μm) | D10 | D90 | Relative fluorescence peak intensity | Peak wavelength (nm) |
| Example 2 | 2.12 | 0.59 | 26.5 | 9.8 | 41.1 | 180% | 585 |
| Example 3 | 1.85 | 0.48 | 8.5 | 3.8 | 34.2 | 125% | 581 |
| Example 4 | 2.81 | 1.25 | 15.5 | 4.9 | 37.2 | 128% | 590 |
| Example 5 | 2.25 | 0.31 | 30.5 | 10.2 | 43.4 | 158% | 579 |
| Example 6 | 2.42 | 0.88 | 22 | 5.5 | 38.8 | 178% | 586 |
| Comparative Example 2 | 1.65 | 0.62 | 2.3 | 1.1 | 10.5 | 54% | 569 |
| Comparative Example 3 | 2.43 | 0.09 | 23.3 | 10.2 | 39.5 | 95% | 578 |
| Comparative Example 4 | 2.55 | 1.72 | 19.8 | 5.2 | 37.7 | 102% | 594 |

As shown in Table 2 above, the phosphor of Comparative Example 2, which had a small Li content and a small average particle diameter, gave a blueshifted fluorescence peak wavelength and a significantly reduced fluorescence peak intensity. The phosphor of Comparative Example 3 had a smaller Eu content and gave a blueshifted fluorescence peak wavelength and a low fluorescence peak intensity. The phosphor of Comparative Example 4 had a larger Eu content and gave a redshifted fluorescence peak wavelength and a lower fluorescence peak.

In contrast, the phosphors of Examples 2 to 6 gave a peak intensity higher than those of the phosphors of Comparative Examples 1 to 4. The results indicate that it is possible according to the present invention to obtain a phosphor superior in luminous efficiency.

Example 7 and Comparative Example 5

A white LED emitting white light was prepared using the phosphor of Example 1 as the light-emitting element of Example 7. Specifically, the phosphor of Example 1 and a green β-SiAlON phosphor for adjustment of chromaticity (GR-545K produced by DENKI KAGAKU KOGYO KABUSHIKI KAISHA) were added to a silicone resin and the mixture was defoamed and kneaded. The mixture obtained was potted on a surface mounting-type package carrying a blue LED element emitting a light having a peak wavelength of 450 nm and cured thermally, to give a white LED. The chromaticity of the white LED was controlled in the range of the electric lamp color, as specified in the light source color classification of JIS Z9112, as the amounts of the two kinds of phosphors added to the silicone resin were adjusted.

An electric-lamp-color LED was prepared as the light-emitting element of Comparative Example 5 by a method similar to Example 7, except that the phosphor of Comparative Example 1 that has a peak wavelength similar to that of the phosphor of Example 1 was used.

The emission characteristics of the light-emitting element of Example 7 and the light-emitting element of Comparative Example 5 were determined on an emission spectrum analyzer MCPD7000 manufactured by Otsuka Electronics Co., Ltd. under the same condition. Multiple LEDs were tested at a certain chromaticity and the average light intensity of five LEDs having a deviation (Δuv) in the range of ±0.01 at a correlated color temperature of 2800 to 2900K was compared. As a result, the light-emitting element of Example 7 gave a light intensity of 142% with respect to 100% of that of the light-emitting element of Comparative Example 5.

The invention claimed is:

1. A phosphor comprising a (Li and Eu)-containing α-SiAlON crystal represented by a general formula, $Li_x Eu_y Si_{12-(m+n)} Al_{m+n} O_n N_{16-n}$, where x+y≤2, m=x+2y, and having
    a Li content of 1.8 to 3 mass %,
    an Eu content of 0.1 to 1.5 mass %,
    an average primary particle diameter, as determined by laser diffraction/scattering method, of 20.5 to 35 μm, and
    a particle diameter (D10) at a cumulative volume of 10% in particle diameter distribution, as determined by laser diffraction/scattering method, of 4 μm or more and a particle diameter (D90) at a cumulative volume of 90% of 45 μm or less, so as to emit orange light having a peak wave length of 579 to 590 nm in a fluorescence spectrum at an excitation wavelength of 455 nm,
    wherein the average primary particle diameter is determined after acid treatment of the phosphor with a mixed acid of hydrofluoric acid and nitric acid under heat.

2. A light-emitting element comprising:
    the phosphor according to claim 1; and
    a light source irradiating an excitation light to the phosphor.

3. A lighting apparatus comprising the light-emitting element according to claim 2.

4. The phosphor according to claim 1, wherein the average primary particle diameter is 22 to 30.5 μm, and
    the particle diameter (D10) is 4.8 μm or more and the particle diameter (D90) is 43.4 μm or less.

5. The phosphor according to claim 1, wherein using a lithium nitride powder as raw materials.

6. The phosphor according to claim 1, wherein the average primary particle diameter is 22 to 35 μm.

7. The phosphor according to claim 1, wherein the average primary particle diameter is 26.5 to 35 μm.

8. The phosphor according to claim 1, wherein the average primary particle diameter is 30.5 to 35 μm.

* * * * *